United States Patent
Knoener

(10) Patent No.: US 9,845,910 B2
(45) Date of Patent: Dec. 19, 2017

(54) PRESSURE COMPENSATOR FOR SUBSEA DEVICE

(71) Applicant: Siemens Aktiengesellschaft, München (DE)

(72) Inventor: Gregor Knoener, Ottobrunn (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 52 days.

(21) Appl. No.: 14/983,633

(22) Filed: Dec. 30, 2015

(65) Prior Publication Data
US 2016/0215913 A1   Jul. 28, 2016

(30) Foreign Application Priority Data
Jan. 23, 2015   (EP) ..................................... 15152356

(51) Int. Cl.
| | | |
|---|---|---|
| *F16L 55/04* | (2006.01) | |
| *H01F 27/14* | (2006.01) | |
| *E21B 33/035* | (2006.01) | |
| *H05K 5/06* | (2006.01) | |

(52) U.S. Cl.
CPC .......... *F16L 55/04* (2013.01); *E21B 33/0355* (2013.01); *H01F 27/14* (2013.01); *H05K 5/068* (2013.01)

(58) Field of Classification Search
CPC ...... F16L 55/04; E21B 33/0355; H01F 27/14; H05K 5/068
See application file for complete search history.

(56) References Cited

U.S. PATENT DOCUMENTS

| | | | | |
|---|---|---|---|---|
| 3,620,557 A | * | 11/1971 | Sturm .................... | B64G 1/40 285/118 |
| 4,997,009 A | * | 3/1991 | Niikura ............. | B60G 17/0424 138/30 |
| 5,797,430 A | * | 8/1998 | Becke ................. | F04B 11/0016 138/26 |

(Continued)

FOREIGN PATENT DOCUMENTS

| | | |
|---|---|---|
| EP | 2169690 B1 | 8/2012 |
| EP | 2570585 A1 | 3/2013 |
| WO | WO 2010034880 A1 | 4/2010 |

OTHER PUBLICATIONS

Extended European Search Report dated Jul. 24, 2015.

*Primary Examiner* — Benjamin Fiorello
(74) *Attorney, Agent, or Firm* — Harness, Dickey & Pierce, PLC

(57) ABSTRACT

A pressure compensator for providing pressure compensation for a chamber of a subsea device is provided. The pressure compensator has an enclosure with at least an outer wall. A first compensation chamber is provided inside the enclosure. A flow connection from the first compensation chamber towards the chamber of the subsea device is further provided. As second compensation chamber is provided inside the enclosure. First and second separating walls are arranged inside the enclosure. A first bellows portion of the first separating wall and a second bellows portion of the second separating wall are deformable to provide pressure compensation between the chamber of the subsea device and a second inner volume around which the second separating wall extends.

23 Claims, 3 Drawing Sheets

(56) References Cited

U.S. PATENT DOCUMENTS

| | | | | |
|---|---|---|---|---|
| 6,405,760 | B1 * | 6/2002 | Tranter | B60T 7/042 |
| | | | | 138/30 |
| 8,439,080 | B2 * | 5/2013 | Uusipaikka | E21B 33/0385 |
| | | | | 138/26 |
| 2008/0302115 | A1 * | 12/2008 | Eknes | H05K 5/068 |
| | | | | 62/183 |
| 2010/0308589 | A1 * | 12/2010 | Rohrer | F03B 13/188 |
| | | | | 290/53 |
| 2013/0167962 | A1 | 7/2013 | Skjetne et al. | |

* cited by examiner

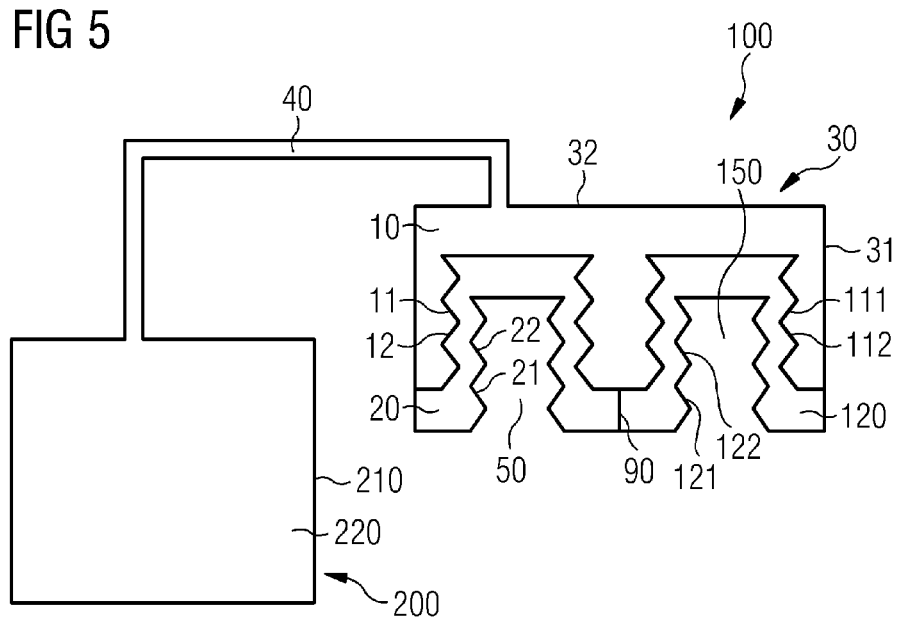

PRESSURE COMPENSATOR FOR SUBSEA DEVICE

PRIORITY STATEMENT

The present application hereby claims priority under 35 U.S.C. §119 to European patent application number EP15152356.0 filed Jan. 23, 2015, the entire contents of which are hereby incorporated herein by reference.

FIELD

At least one embodiment of the invention generally relates to a pressure compensator for compensating volume variations of a liquid in chamber of a subsea device. At least one embodiment of the invention generally relates to a method of manufacturing a pressure compensator.

BACKGROUND

Traditionally, fixed or floating platforms, or floating production vessels, are used in the offshore oil and gas production. In the operation of offshore platforms, it can be necessary to install electrical equipment under water, e.g. for controlling functions of a subsea Christmas tree or a subsea blowout preventer. More recently, processing facilities are being relocated to the ocean floor. Installations on the ocean floor can comprise a range of components, including pumps, compressors and the like which require electric power for operation. Power supply can occur through a subsea power grid installed on the ocean floor, which may for example comprise a subsea transformer, a subsea switchgear and a subsea variable speed drive for powering the above mentioned subsea loads. It needs to be ensured that the installed equipment operates reliably even under the high pressure that prevails at the rated installation depth which can be 3.000 m or more.

To protect the equipment from the corrosive environment of the surrounding seawater and to deal with the high pressures, two different solutions were proposed. A pressure resistant enclosure can be provided, which has a close to atmospheric internal pressure, enabling the use of conventional electric and electronic components therein. Such enclosures need to have relatively thick walls and are thus bulky and heavy, since they have to withstand high differential pressures.

Another solution is the use of pressurized (or pressure compensated) enclosures, which comprise a pressure compensator that balances the pressure in the enclosure to the pressure prevailing in the ambient seawater.

The pressurized enclosure is generally filled with a liquid, and components operated inside the pressurized enclosure are made to be operable under high pressures. The pressure compensator balances the pressure and compensates variations in the volume of the liquid filling the enclosure, which may for example occur due to variations in outside pressure and/or temperature. Temperature changes can also be caused by internal heating, e.g. by electric losses of components provided inside the enclosure of the subsea device. The corresponding volume increase of the liquid filling the enclosure may then be taken up by the pressure compensator, which is thus also termed volume compensator.

Pressure compensators may include bellows, bladders, pistons, membranes or the like. Bellows can have the disadvantage that they are either expensive to produce, or their configuration is such that the stroke length of the bellows is limited. In the latter case, a pressure compensator for a large volume of liquid (i.e. for an enclosure of a large subsea device) needs to have a significant size to provide the required compensation capacity. For some types of bellows, the bellows needs to have a size of more than three times of the size of the compensated volume. This results in a low utilization factor of the volume of the compensator system. Furthermore, the liquid filling such pressure compensator needs to be compensated itself (i.e. changes of its volume due to temperature/pressure changes need to be taken up by the compensator). Such compensator systems can thus be relatively large and heavy.

Furthermore, the bellows of such pressure compensator is often exposed to the subsea environment, in particular to the seawater. This may cause corrosion problems for the bellows and may lead to the ingress of seawater into the enclosure of the subsea device upon failure of the bellows.

The document WO2010/034880A1 describes a pressure compensator that has a first bellows chamber that is surrounded by a second bellows chamber, the second bellows chamber forming a closed intermediate space around the first bellows chamber. A double barrier against the ingress of sea water is thus provided. In the disclosed configuration, the compensation capacity is determined by the size of the first bellows. The whole volume inside the first bellows chamber and in addition the volume inside the second bellows chamber are dead volumes, the liquid filling these volumes additionally requiring pressure compensation. In such configuration, the pressure compensator needs to have a significant size and an increase in the compensation capacity results in a significant increase in the dead volume.

It is desirable to provide a pressure compensator for use with a subsea device that can be manufactured easily and cost efficiently. It is further desirable that the pressure compensator is reliable during operation and has a long lifetime. It is desirable to reduce the size of pressure compensators, and to increase the utilization factor and compensation capacity. Also, it is desirable that the pressure compensator is protected from corrosion and provides protection against seawater ingress.

SUMMARY

Accordingly, the inventors have recognized that there is a need to obviate at least some of the drawbacks mentioned above and to provide an improved pressure compensator for subsea use.

The claims describe embodiments of the invention.

An embodiment of the invention provides a pressure compensator for providing pressure compensation for a chamber of a subsea device. The pressure compensator comprises an enclosure having at least an outer wall, a first compensation chamber provided inside the enclosure and a flow connection from the first compensation chamber towards the chamber of the subsea device. The first separating wall is arranged inside the enclosure, the first separating wall having a first bellows portion. At least part of the first compensation chamber is formed between the outer wall and the first separating wall. The first separating wall extends around a first inner volume and provides separation between the first inner volume and the first compensation chamber. The pressure compensator further comprises a second compensation chamber provided inside the enclosure. A second separating wall is arranged inside the enclosure, the second separating wall having a second bellows portion and extending at least partially into the first inner volume. At least part of the second compensation chamber is formed between the first separating wall and the second separating wall. The second separating wall extends around a second inner volume and provides separation between the second compensation chamber and the second inner volume. The first bellows portion and the second bellows portion are deformable to provide pressure compensation between the chamber of the subsea device and the second inner volume.

According to a further embodiment of the invention, a subsea device, such as a subsea transformer, subsea converter, in particular a subsea variable speed drive, or a subsea switchgear is provided. The subsea device comprises a pressure compensator providing pressure compensation for a chamber of the subsea device, the pressure compensator being configured in accordance with any of the above outlined embodiments and configurations.

Furthermore, an embodiment of the invention provides a method of manufacturing a pressure compensator for providing pressure compensation for a chamber of a subsea device. The method includes the steps of providing an enclosure having at least an outer wall; providing a first compensation chamber inside the enclosure by arranging at first separating wall inside the enclosure, wherein at least part of the first compensation chamber is formed between the outer wall and the first separating wall, the first separating wall having a first bellows portion and extending around a first inner volume, the first separating wall providing separation between the first inner volume and the first compensation chamber; providing a second compensation chamber inside the enclosure by arranging a second separating wall inside the enclosure, wherein the second separating wall has a second bellows portion and extends at least partially into the first inner volume, wherein at least part of the second compensation chamber is formed between the first separating wall and the second separating wall, the second separating wall extending around a second inner volume and providing separation between the second compensation chamber and the second inner volume; and providing a flow connection from the first compensation chamber towards a chamber of the subsea device. The first bellows portion and the second bellows portion are deformable to provide pressure compensation between the chamber of the subsea device and the second inner volume. By such method, a pressure compensator may be obtained that has advantages similar to the ones outlined further above.

It is to be understood that the features mentioned above and those yet to be explained below can be used not only in the respective combinations indicated, but also in other combinations or in isolation without leaving the scope of the present invention.

BRIEF DESCRIPTION OF THE DRAWINGS

The foregoing and other features and advantages of the invention become further apparent from the following detail description read in conjunction with the accompanying drawings. In the drawings, like reference numerals refer to like elements.

FIG. 5 is a schematic drawing showing a sectional side view of a pressure compensator and a subsea device according to a further embodiment of the invention.

DETAILED DESCRIPTION OF THE EXAMPLE EMBODIMENTS

Figure 1:
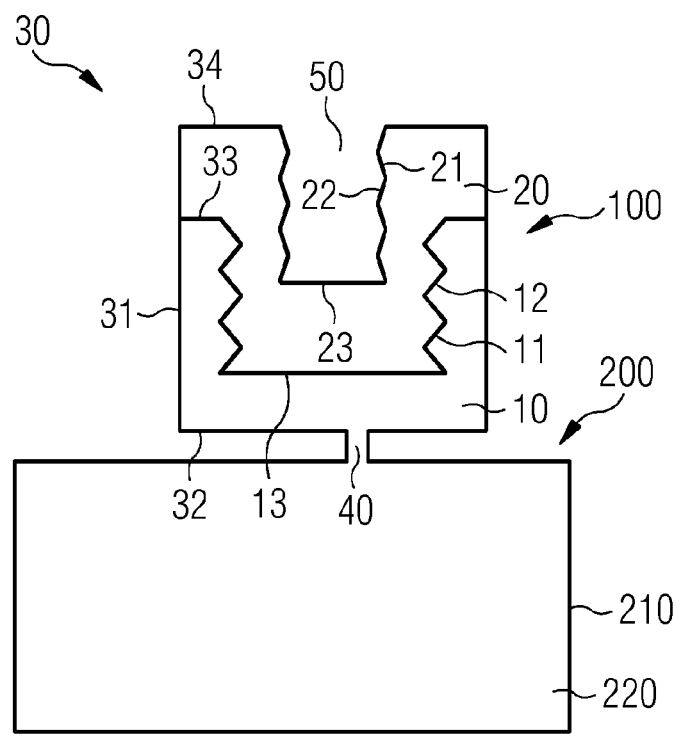
FIG. 1 is a schematic drawing showing a sectional side view of a pressure compensator and a subsea device according to an embodiment of the invention.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Further, although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

An embodiment of the invention provides a pressure compensator for providing pressure compensation for a chamber of a subsea device. The pressure compensator comprises an enclosure having at least an outer wall, a first compensation chamber provided inside the enclosure and a flow connection from the first compensation chamber towards the chamber of the subsea device. The first separating wall is arranged inside the enclosure, the first separating wall having a first bellows portion. At least part of the first compensation chamber is formed between the outer wall and the first separating wall. The first separating wall extends around a first inner volume and provides separation between the first inner volume and the first compensation chamber. The pressure compensator further comprises a second compensation chamber provided inside the enclosure. A second separating wall is arranged inside the enclosure, the second separating wall having a second bellows portion and extending at least partially into the first inner volume. At least part of the second compensation chamber is formed between the first separating wall and the second separating wall. The second separating wall extends around a second inner volume and provides separation between the second compensation chamber and the second inner volume. The first bellows portion and the second bellows portion are deformable to provide pressure compensation between the chamber of the subsea device and the second inner volume.

By providing a pressure compensator with such configuration, the dead volume may be reduced significantly, and the compensation capacity may be improved. Accordingly, a more compact pressure compensator may be achieved. Furthermore, since the pressure compensation is performed by the bellows portions that are arranged inside the enclosure, the first bellows portion may be protected by the outer wall from mechanical damage and/or corrosion. Furthermore, the first bellows portion provides separation between the first compensation chamber and the second compensation chamber, and is thus not exposed to ambient medium, in particular seawater.

In particular, each separating wall may be located inside the enclosure, i.e. within the outer perimeter of the enclosure. The first compensation chamber may be in flow communication with the chamber of the subsea device, the pressure compensator may thus compensate volume variations of a liquid filling such chamber of the subsea device. The respective bellows portion may also be referred to as bellows part, or bellows. In particular, the respective separating wall may comprise or consist of such bellows part or bellows.

In an embodiment, the second inner space is in flow communication with ambient medium, such as seawater. In operation, ambient medium may be present inside the second inner volume, and the second separating wall may provide separation between the second compensation chamber and the ambient medium. In particular, the second separating wall may in such configuration be in contact with seawater. By allowing seawater to enter the second inner volume, which is located inside the enclosure, the dead volume of the pressure compensator may be reduced.

In other embodiments, a further separating wall may be arranged inside the enclosure and may extend into the second inner volume to form a third compensation chamber, thus providing protection for the second bellows portion of the second separating wall.

In an embodiment, the compensation chamber has an annularly shaped portion formed between the outer wall and the first separating wall. Such shape of the first compensation chamber may achieve a relatively small dead volume without reducing the compensation capacity of the pressure compensator.

The outer wall, the first separating wall and/or the second separating wall may have a circumferentially extending shape, in particular a cylindrical or tubular shape. Yet in other embodiments, these walls may have different shapes, the outer wall may for example have a rectangular cross section. By providing the outer wall, the first separating wall and the second separating wall with a cylindrical or tubular shape, a relatively small dead volume between the outer wall and the first separating wall of the first compensation chamber, and a relatively small dead volume between the first separating wall and the second separating wall of the second compensation chamber may be achieved.

When viewed in a cross section along a central axial direction of the pressure compensator, the first compensation chamber may have an U-shape. The central axial direction may for example be the central (symmetry) axis of the cylindrical or tubular shape. In particular, it may by an axis in the direction of which the bellows portions expand and contract. By providing the first compensation chamber in such shape, the volume of the first compensation chamber may be relatively small when the first bellows portion is fully extended, while the volume of the first compensation chamber may increase significantly and may achieve a considerable size upon contraction of the first bellows portion.

In an embodiment, the pressure compensator further comprises a first moveable end wall, the first moveable end wall being mounted and sealed to an end of the first separating wall and being moveable with a deformation of the first bellows portion. Further, the pressure compensator may comprise a second moveable end wall, the second moveable end wall being mounted and sealed to an end of the second separating wall and being moveable with a deformation of the second bellows portion. In other embodiments, a common moveable end wall may be provided to which both the first and the second separating walls are mounted and sealed. The first, second or common moveable end wall may for example have a plate or disk shape, and movement of the respective moveable end wall, due to the contraction of the respective bellows portion, may lead to a significant volume change of e.g. the first compensation chamber.

The first separating wall may have a second end that is mounted stationary with respect to the outer wall. Similarly, the second separating wall may have a second end that is mounted stationary with respect to the outer wall. The first and/or second separating wall may for example be mounted to the outer wall via an annular wall section, such as a flange.

In an embodiment, the outer wall is a rigid outer wall that substantially maintains its shape during operation of the pressure compensator. In other words, the outer wall does not deform (substantially) during operation of the pressure compensator. In particular, the outer wall is not a bellows and does itself not have any pressure compensation functionality. Accordingly, such outer wall may provide mechanical protection for the bellows portions located within the enclosure.

At least the outer wall provides separation of the first compensation chamber towards an ambient medium, in particular seawater. The first bellows portion of the first separating wall is thus protected from ambient medium by the first compensation chamber and the outer wall. In case of a first bellows portion made of metal, corrosion may thus be prevented while in case of a first bellows portion made of an elastomeric material, such as a rubber material, diffusion or permeation of seawater through the bellows portion may be prevented.

The pressure compensator may comprise an annual wall section mounted to the outer wall and extending radially inwardly. An end of at least the first separating wall may be mounted and sealed to the annular wall section. In some embodiments, the annular wall section may be provided by a flange, for example on the outer wall or on the first separating wall, or by two such flanges. By adjusting the size of the annular wall section, the spacing between the outer wall and the first separating wall and thus the dead volume therebetween may be adjusted.

One end of the second separating wall may be mounted and sealed to this annular wall section. In other embodiments, the pressure compensator may comprise a further annular wall section mounted to the outer wall and extending radially inwardly, and the end of the second separating wall may be mounted and sealed to the further annular wall section. The further annular wall section may be configured similar to the first mentioned annular wall section.

The outer wall may extend circumferentially around an inner volume and may at one end be mounted and sealed to an outer end wall. Depending on the shape of the cross section of the outer wall, the outer end wall may for example have a rectangular or circular shape, for example a plate or disk shape.

In an embodiment, the first separating wall has a tubular shape and is at one end mounted and mechanically fixed to the outer wall, for example by way of the above mentioned annular wall section, and the other end of the first separating wall extends inside the inner volume towards the outer end wall and is mounted and sealed to a moveable end wall. The first compensation chamber may in such configuration be bounded by at least the outer wall, the outer end wall, the first separating wall and the moveable end wall, and may further be bounded by the above mentioned annular wall section.

The second separating wall may have a tubular shape and may at one end be mounted and mechanically fixed to the outer wall, for example by way of the above mentioned annular wall section. The other end of the second separating wall may extend inside the inner volume towards the outer end wall, and may be mounted and sealed to a moveable end wall. The second compensation chamber may be bounded by at least the first separating wall, the second separating wall, and the moveable end wall, and may furthermore be bounded by the annular wall section.

The first bellows portion may provide separation between the first compensation chamber and the second compensation chamber. Where first and second moveable end walls are provided, the second compensation chamber may be bounded by both, the first and the second moveable end walls. Where a common moveable end wall is provided, the second compensation chamber may be bounded by a portion of the common moveable end wall. In the former case, the second compensation chamber may have a substantially U-shaped cross section, whereas in the latter case, the second compensation chamber may have an annular or toroidal shape.

Sealed means that in particular a liquid tight seal is provided. Such liquid tight seal may for example comprise one or more elastomeric O-ring seals, one or more metal O-ring seals, a weld, or a combination thereof. In other configurations, mounted and sealed also comprises that components, such as wall sections, may be made integrally or from a single piece of material. A separating wall and a respective moveable end wall may for example be molded together from an plastic or elastomeric material. Also in such configuration, the moveable end wall is considered to be mounted and sealed to the respective separating wall. Liquid tight means that the seal does not pass a liquid, in particular dielectric liquid such as oil or metal, or water. A liquid tight seal may also be gas-tight, it may be a hermetic seal.

The outer wall may extend circumferentially around an inner volume, and the first compensation chamber occupies only a fraction of the inner volume. In particular, the first compensation chamber may occupy a first fraction of the inner volume, the second compensation chamber may occupy a second fraction of the inner volume and the second inner volume may occupy a third fraction of said inner volume. Accordingly, not the whole volume inside the enclosure is dead volume, and for example by providing the second inner volume with a considerable size, the dead volume can be reduced significantly.

The first and/or the second separating wall may substantially consist of the respective bellows portion and elements for mounting them, thus providing a relatively large pressure compensation capacity. In other embodiments, the bellows portion may only constitute a part of the axial extension of the respective separating wall, it may constitute for example at least 30%, at least 50%, or at least 70% of the axial extension of the respective separating wall. Accordingly, a remaining portion of the respective separating wall may not be deformable by contraction and expansion. Such rigid wall portion may for example be used for mounting purposes, or for adjusting the volume in a particular region of the pressure compensator, e.g. for reducing dead volume.

The walls of the second compensation chamber may be arranged such that the first bellows portion is not exposed to ambient medium, in particular to seawater, when the pressure compensator is deployed subsea.

The first compensation chamber and/or the second compensation chamber is filled with a medium, in particular a liquid, preferably a dielectric liquid, such as oil or Midel (synthetic ester).

The first bellows portion and/or the second bellows portion may be made of metal, a plastic material, an elastomeric material, a polymer material, a rubber material or the like. In an embodiment, the first bellows portion is made of metal, and the second bellows portion is made of an elastomeric material. In such configuration, the metal of the first bellows portion may be protected from corrosion. In another embodiment, the first bellows portion may be made of an elastomeric material, such as rubber, whereas the second bellows portion may be made from metal. In such configuration, the diffusion or permeation of ambient medium, in particular seawater, into the second compensation chamber can be prevented, since a metal bellows portion does not allow the diffusion or permeation of such ambient medium.

Other walls of the pressure compensator, in particular the outer wall, the outer end wall, and the annular wall section, may be made from metal, in particular steel. The first, second or common moveable end wall may be made from a metal or polymer material, for example rubber. One or more components may furthermore comprise a protective coating or the like. As an example, if the second bellows portion is made from metal, it may furthermore be protected by an additional rubber coating, or it may further be protected by a third compensation chamber employing a third bellows portion, as outlined above.

The pressure compensator may furthermore comprise a guiding arrangement for guiding the movement of the first and/or second bellows portions. A guiding arrangement may for example comprise two or more telescopically arranged cylinders, for example mounted on one end to the first or the common moveable end plate and on the other end to the outer end wall, thus guiding the movement of the first or of both bellows portions. A guiding arrangement may also include guiding rods, such as commonly known from expansion joints. A guiding arrangement may also be provided within the second inner volume, and may be fixed to the enclosure, for example to an annular wall section of the enclosure.

In an embodiment, the pressure compensator is adapted to be operable at a water depth of at least 1.000 m, preferably at least 2.000 m or at least 3.000 m. As an example, the change in volume of the liquid filling the chamber of the subsea device for which the pressure compensator is employed can be determined for such water depth and at the respective operating conditions, e.g. temperature changes. The pressure compensator may then be dimensioned such that it is capable of compensating the expected volume changes. The diameter of the compensator or the stroke length of the first and/or second bellows portion may for example be adjusted.

In an embodiment, the pressure compensator comprises at least two second compensation chambers, and further comprises at least a third separating wall which provides separation between the at least two second compensation chambers. Each second compensation chamber may be bounded by a second separating wall having a second bellows portion. In such configuration, if one of the bellows portions of the two second separating walls fails, it may be possible to cease operation for one of the second bellows portions and continue operation with the other intact second bellows portion. As an example, valves may be provided for shutting off the flow connection between the second inner volume and the ambient medium, thus preventing excessive ingress of seawater into the second compensation chamber.

According to a further embodiment of the invention, a subsea device, such as a subsea transformer, subsea converter, in particular a subsea variable speed drive, or a subsea switchgear is provided. The subsea device comprises a pressure compensator providing pressure compensation for a chamber of the subsea device, the pressure compensator being configured in accordance with any of the above outlined embodiments and configurations.

Furthermore, an embodiment of the invention provides a method of manufacturing a pressure compensator for providing pressure compensation for a chamber of a subsea device. The method includes the steps of providing an enclosure having at least an outer wall; providing a first compensation chamber inside the enclosure by arranging at first separating wall inside the enclosure, wherein at least part of the first compensation chamber is formed between the outer wall and the first separating wall, the first separating wall having a first bellows portion and extending around a first inner volume, the first separating wall providing separation between the first inner volume and the first compensation chamber; providing a second compensation chamber inside the enclosure by arranging a second separating wall inside the enclosure, wherein the second separating wall has a second bellows portion and extends at least partially into the first inner volume, wherein at least part of the second compensation chamber is formed between the first separating wall and the second separating wall, the second separating wall extending around a second inner volume and providing separation between the second compensation chamber and the second inner volume; and providing a flow connection from the first compensation chamber towards a chamber of the subsea device. The first bellows portion and the second bellows portion are deformable to provide pressure compensation between the chamber of the subsea device and the second inner volume. By such method, a pressure compensator may be obtained that has advantages similar to the ones outlined further above.

It is to be understood that the features mentioned above and those yet to be explained below can be used not only in the respective combinations indicated, but also in other combinations or in isolation without leaving the scope of the present invention.

In the following, embodiments of the invention are described in detail with reference to the accompanying drawings. It is to be understood that the following description of the embodiments is given only for the purpose of illustration and is not to be taken in a limiting sense. It should be noted that the drawings are to be regarded as being schematic representations only, and elements in the drawings are not necessarily to scale with each other. Rather, the representation of the various elements is chosen such that there function and general purpose become apparent to a person skilled in the art.

FIG. 1 schematically illustrates a subsea device 200 having a subsea enclosure 210 which encloses a chamber 220. Subsea device 200 may for example be a subsea transformer, a subsea converter, in particular a subsea variable speed drive, a subsea switchgear, a subsea motor, a subsea control and/or communication module or the like. Accordingly, respective mechanical, electric and/or electronic components may be disposed in the chamber 220. Chamber 220 is pressure compensated via pressure compensator 100. It should be clear that subsea device 200 may comprise one or more pressure compensated chambers, and may additionally comprise one or more chambers in which a predetermined pressure is maintained (pressure resistant chambers), for example a close to atmospheric pressure (e.g. below 10 or 5 bar, e.g. about 1.5 bar). Accordingly, some components which may not be operable under the high subsea pressures may be placed in a pressure resistant enclosure inside the chamber 220, or adjacent thereto, or the like.

FIG. 1 illustrates an embodiment of a pressure compensator 100 for the subsea device 200. Pressure compensator 100 has an enclosure 30 having an outer wall 31. In the example of FIG. 1, outer wall 31 has a cylindrical or tubular shape, yet it may have a different shape in other embodiments, for example a shape with a rectangular cross section or the like. The outer wall 31 extends circumferentially around an inner volume. This inner volume is in particular defined by the outer perimeter of the enclosure 30. One end of the tubular outer wall 31 is closed by the outer end wall 32, which has a plate shape or disc shape in the present example. It should be clear that other configurations are also possible; outer wall 31 and outer end wall 32 may for example be formed integrally as a single outer wall, having for example a canister, barrel or hemispherical shape or the like. The outer wall 31 is a rigid wall, it may be made of a rigid material such as metal, in particular steel. Rigid means that the outer wall 31 substantially maintains its shape during operation of the pressure compensator 100, i.e. it does not deform when the pressure compensator 100 is in operation and provides volume/pressure compensation. Similarly, the outer end wall 32 is a rigid end wall.

Inside the enclosure 30, a first compensation chamber 10 and a second compensation chamber 20 are provided. A first separating wall 11 is arranged inside the enclosure 30. The first separating wall 11 has a cylindrical or tubular shape and extends around a first inner volume (i.e. the space inside the first separating wall 11, i.e. inside the tubular or cylindrical shape). The first separating wall 11 has a bellows portion 12. In the example of FIG. 1, the bellows portion 12 makes up almost the entire axial extension of the first separating wall 11. Part of the first compensation chamber 10 is formed between the outer wall 31 and the first separating wall 11. Accordingly, this part of the first compensation chamber 10 has an annular or toroidal shape. Note that the main components of the pressure compensator 100 may be rotationally symmetric around its central axes.

The first separating wall 11 has a stationary end at which it is mounted to the outer wall 31 by way of the annular wall section 33. Wall section 33 has an annular or ring shape.

The other end of the first separating wall 11 is a moveable end which moves with a deformation, in particular compression and expansion, of the bellows portion 12. Moveable end wall 13 is mounted to this moveable end of the first separating wall 11.

Accordingly, in the example of FIG. 1, the first compensation chamber 10 is bounded by the outer wall 31, the annular wall section 33, the outer end wall 32, the first separating wall 11 and the moveable end wall 13. By deformation of the bellows portion 12, in particular expansion or contraction, the volume of the first compensation chamber 10 can be changed significantly. At the same time, the dead volume inside the first compensation chamber 10 can be kept relatively small. As an example, the spacing between the outer wall 31 and the first separating wall 11 can be made relatively small, resulting in only a small dead volume in this part of the first compensation chamber 10. Furthermore, the bellows portion 12 may have a state of maximum expansion (which may be defined by an expansion stop, not shown), in which the moveable end plate 13 is located relatively close to the outer end wall 32. The dead volume between these end walls 13, 32 may thus also be made relatively small, it may even be made closed to zero if the end walls are allowed to touch.

On the other hand, the bellows portion 12 may have a state of a defined maximum compression (a respective compression stop may be provided; not shown) in which the moveable end plate 13 has a relatively large distance from the outer end wall 32. In such state, the volume between these two end walls has a significant size, thus being capable of taking up a significant amount of liquid for pressure compensation purposes, e.g. from within the chamber 220 of the subsea device 200. Accordingly, the first compensation chamber 10 and thus the pressure compensator 100 have a relatively large compensation capacity. Since the dead volume within the first compensation chamber 10 can be made small, the required volume compensation for the liquid filling this dead volume is also relatively small. This further increases the compensation capacity of pressure compensator 100 that is available for compensating volume variations of the liquid filling the chamber 220 of the subsea device 200.

To allow the first compensation chamber 10 to provide the pressure compensation for subsea device 200, a flow connection 40 from the first compensation chamber 10 towards the chamber 220 of the subsea device 200 is provided. This flow connection may for example be provided in form of a tube, piping, flow channel, or the like. In some configurations, the enclosure 30 of the pressure compensator 100 may be integrated with the enclosure 210 of the subsea device 200, so that the flow connection may simply be provided by opening up the first compensation chamber 10 towards the inner volume of the enclosure 210. As such, enclosures 30 and 210 may be formed as a single enclosure, with the first compensating chamber 10 and the chamber 220 forming a single chamber. In other embodiments, flow connection 40 may comprise features such as filters or the like which prevent contamination or pollution to be passed between the chambers 10 and 220. In further embodiments, a separation may be provided between the liquid filling chamber 10 and the liquid filling chamber 220, for example by way of a moveable plug or piston within the flow connection 40. Preferably, the flow connection 40 provides a fluid passage for the liquid filling the compensation chamber 10 and the chamber 220.

The pressure compensator 100 further comprises a second compensation chamber 20 provided inside the enclosure 30. The second separating wall 21 is arranged inside the enclosure 30 and comprises a second bellows portion 22. As illustrated in FIG. 1, the second separating wall 21 extends at least partially into the first inner volume that is defined by the first separating wall 11. In other words, when seen from a central axis of the pressure compensator 100 in radial direction, the first and second separating walls 11, 21 overlap. Accordingly, part of the second compensation chamber 20 is formed between the first separating wall 11 end the second separating wall 21. The second separating wall 21 extends around a second inner volume 50. The second inner volume 50 is generally filed with a medium against which the chamber 220 of subsea device 200 is pressure compensated. In some embodiments, this may be seawater, when the subsea device 200 is deployed subsea. In other embodiments, this may be a further intermediate medium, that may for example be provided inside a third compensation chamber, for example for providing protection for the bellows portion 22 of the second separating wall 21.

The second separating wall 21 has a stationary end which is mounted to the outer wall 31 via the further annular wall section 34. The other end of the second separating wall 21 is a moveable end that moves with compression and expansion of the bellows portion 22, the moveable end being mounted to a second moveable end wall 23. The second compensation chamber 20 may thus be bounded by the first separating wall 11 and the second separating wall 21, and may further be bounded by the outer wall 31, the further annular wall section 34, the first moveable end wall 13 and the second moveable end wall 23. Note that in other configurations, only one annular wall section may be provided, or only one moveable end wall may be provided, so that the second compensation chamber 20 may have a different shape.

The second bellows portion 22 may be configured to have an expanded state in which the distance between the first and second moveable end walls 13, 23 is relatively small, so that the dead volume present between these two moveable end walls is relatively small. Furthermore, the distance between the first and second separating walls 11, 21 can be made relatively small, so that the dead volume between these separating walls is also relatively small. Accordingly the dead volume of the second compensation chamber 20 can be kept relatively small. Furthermore, the dead volume may be adjusted by changing the distance between the annular wall section 33 and the further annular wall section 34. The volume of liquid that is present in the second compensation chamber 20 can thus be kept small, so that the compensation required for this liquid volume due temperature and/or pressure changes is small.

The compensation for the liquid filling the second compensation chamber 20 may be provided by a different movement of the first and second moveable end walls 13, 23, by a respective sizing (in diameter and/or in length) of the first and second bellows portions 11, 22, and/or by the geometry of the first and second compensation chambers 10, 20. In some embodiments, the configuration can be such that the first and second moveable end plates 13, 23 can move similarly during operation of pressure compensator 100. In particular for such configurations, a common moveable end wall may be provided. The moveable end of the second separating wall 21 may for example be mounted to the first moveable end wall 13. Such configurations having a common moveable end wall may also be achieved by allowing the first and/or the second bellows portion 12, 22 to bulge, thus accounting for volume changes of the liquid filling the second compensation chamber 20 or for volume changes of the second compensation chamber 20 upon movement of the common end wall.

By way of the second bellows portion 22, the change in volume due to compression/expansion of the first bellows portion 12 may thus be compensated, as well as any change in volume of the liquid filling the second compensation chamber 20. Accordingly, when deployed subsea, the pressure of the seawater filling the second inner volume 50 is transmitted via the first and second bellows portions 12, 22 into the liquid of the first compensation chamber 10 and thus into the chamber 220 of the subsea device. Pressure compensator 100 thus balances the pressure between the subsea high pressure environment and the medium filling the chamber 220.

Note that such pressure balancing functionality may include the generation of a relatively small pressure difference, in particular an overpressure, inside the chamber 220. This may be achieved for example by biasing the first and/or the second bellows portions 12, 22. Biasing may for example occur by providing one or both moveable end walls 13, 23 or a common moveable end wall with a weight that provides the desired overpressure inside the first/second compensation chamber 10/20 and thus inside the chamber 220 of the subsea device. Other biasing devices include a certain pretensioning of the respective bellows portion, application of a spring force to one or both moveable end walls, or the like. Generation of a small overpressure may prevent the ingress of seawater into chamber 220 upon occurrence of a small leak, and may furthermore allow detection of the occurrence of such leak due to a respective drift in the compression/expansion state of one or both bellows portions 12, 22 of pressure compensator 100.

Pressure compensator 100 further compensates volume variations of the liquid filling the chamber 220. As an example, upon expansion of the liquid volume, the first bellows portion 12 is compressed, thus increasing the volume of the first compensation chamber 10, which takes up the additional volume. Similarly, the second bellows portion 22 is compressed, so that the volume of the second compensation chamber 20 is kept relatively constant, it may change with a change in the volume of the liquid filling this chamber 20. Accordingly, a pressure build-up within the subsea device 200 can be prevented.

Chamber 220 and first and second compensation chambers 10, 20 are filled with a liquid, in particular dielectric liquid. The first bellows portion 12 provides separation between the first and second compensation chambers 10, 20. Accordingly, the first bellows portion 12 is only exposed to the dielectric liquid filling these chambers. The first bellows portion 12 can thus be protected from corrosion caused by contact with seawater. Furthermore, diffusion or permeation of seawater does generally not pose a problem, since on both sides of bellows portion 12, dielectric liquid is present.

The second separating wall 21 and in particular the second bellows portion 22 provides separation between the second compensation chamber 20 and the medium filling the second inner volume 50, in particular seawater. A fraction of the inner volume of enclosure 30 (i.e. within its outer perimeter) may thus be filled with seawater.

The first compensation chamber 10 is sealed in a liquid tight manner from the ambient medium. Similarly, the second compensation chamber 20 is sealed in a liquid tight manner from the ambient medium and from the first compensation chamber 10. A liquid tight seal may for example be provided by way of an elastomeric or metal O-ring seal, or may also be provided by welding, brazing, soldering or the like. As an example, the second separating wall 21, in particular the second bellows portion 22, may have a flange, via which it is mounted, in particular bolted, to the annular wall section 34. At least one, preferably at least two seals may be provided between such flange and the respective wall section, for example two elastomeric O-ring seals, two metal O-ring seals, a combination thereof or the like. The second separating wall 21, in particular the second bellows portion 22 may in a similar way be mounted and sealed to the second moveable end wall 23. The same may be used for mounting and sealing the first separating wall 11, in particular the first bellows portion 12. In other embodiments, the first and/or second separating end wall 11, 12 end the respective moveable end wall, or the respective annular wall section may be made integrally, for example by molding from the same elastomeric material or the like.

Pressure compensator 100 may comprise further components. An example is a guiding arrangement that guides the movement of the first and/or second moveable end wall 13, 23, or of a common moveable end wall. Further components may comprise a protection structure, such as a roof like structure or a filter structure to prevent debris from entering the second inner volume 50, or for preventing marine growth. It may further comprise a mount or support for mounting the pressure compensator 100 to the enclosure 210 of the subsea device.

Figure 2:
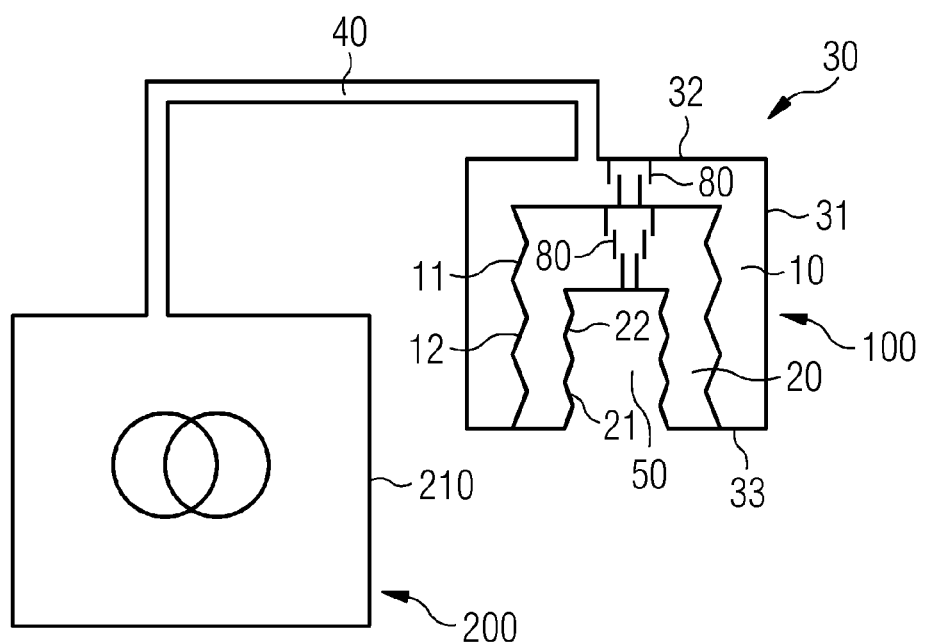
FIG. 2 is a schematic drawing showing a sectional side view of a pressure compensator and a subsea device according to a further embodiment of the invention.

FIG. 2 illustrates a pressure compensator 100 according to a further embodiment of the invention, which is a modification of the pressure compensator shown in FIG. 1. Accordingly, the explanations given above are equally applicable. In the pressure compensator 100 of FIG. 2, only a single annular wall section 33 is provided, to which both the first and the second separating walls 11, 21 are mounted. A more compact configuration may thus be achieved. Also, the dead volume of the second compensation chamber 20 may be reduced by using such common annular wall section 33.

Whereas in the embodiment of FIG. 1, the second inner volume 50 is open on an upper side thereof, it is in the embodiment of FIG. 2 open on a lower side thereof. Accordingly, the accumulation of debris within the second inner volume 50 may be prevented.

Furthermore, FIG. 2 illustrates a guiding structure 80 provided inside the pressure compensator 100. The guiding structure 80 comprises several telescopically arranged cylinders, which are slidable within each other. Guidance and stability against axial displacement of the moveable ends of the first and second separating walls may thus be achieved. Other implementations of the guiding structure 80 are certainly conceivable, such as the provision of guiding rods as commonly known from expansion joints or the like.

In the example of FIG. 2, the subsea device 200 is shown as being a subsea transformer. It should be clear that the pressure compensator 100 of any embodiment may be used with other subsea devices, such as the ones outlined further above.

Figure 3:
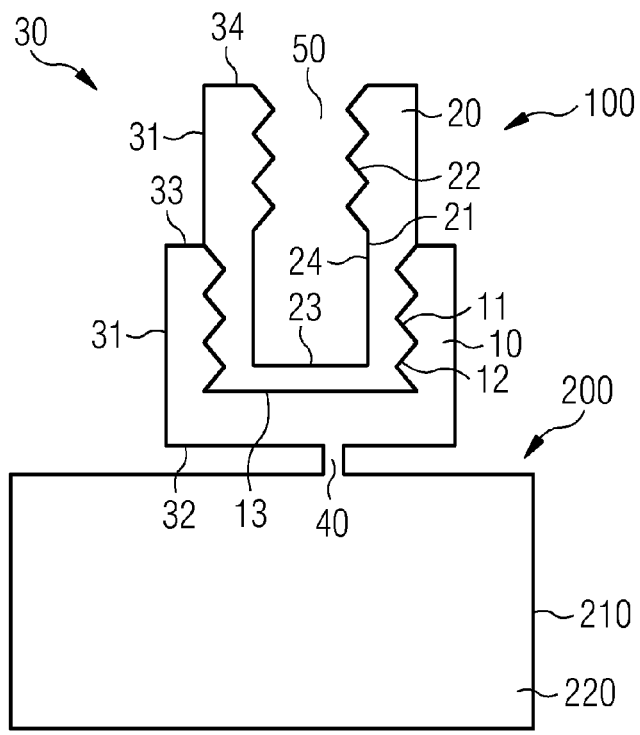
FIG. 3 is a schematic drawing showing a sectional side view of a pressure compensator and a subsea device according to a further embodiment of the invention.

FIG. 3 schematically illustrates a further modification of the pressure compensator 100, so that the explanations given above an equally applicable to pressure compensator 100 of FIG. 3. In the example of FIG. 3, only a fraction of the axial extension of the second separating wall 21 is provided by the bellows portion 22, the other section being provided by a rigid wall section 24 of cylindrical shape. By adjusting the ratio between the bellows portion 22 and the rigid wall section 24, and/or the axial extension of the second separating wall section 21, the compensation capacity of the second compensation chamber 20 may by adjusted. As an example, it may be chosen such that the second compensation chamber 20 can maintain its volume for a maximum compression and expansion of the first bellows portion 12. Furthermore, the upper part of the outer wall 31 has a reduced diameter, thus reducing the dead volume of the second compensation chamber 20.

Figure 4:
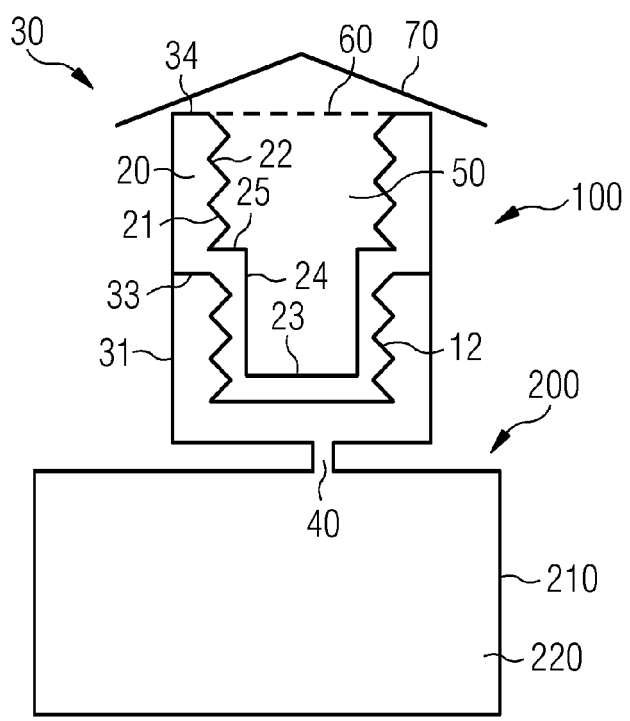
FIG. 4 is a schematic drawing showing a sectional side view of a pressure compensator and a subsea device according to a further embodiment of the invention.

FIG. 4 again is a schematic illustration of a further embodiment of the pressure compensator 100 to which the above explanations are applicable. In the embodiment of FIG. 4, the second separating wall has again a bellows portion 22 and a rigid wall section 24. These are connected by a further annular wall section 25, so that the bellows portion 22 and the rigid wall section 24 can have a different diameter. Accordingly, the first and second bellows portions 12, 22 may have a similar diameter and similar characteristics, whereas the dead volume of the second compensation chamber 20 can be kept low. Furthermore, as the annular wall section 25 moves away from the annular wall section 33 during compression of the second bellows portion 22, the volume of the second compensation chamber 20 changes significantly, thus increasing the pressure compensation capacity of the second compensation chamber 20.

Furthermore, the embodiment of FIG. 4 includes a protection device in form of filter 60 that may prevent debris, pollution and marine growth from entering the second inner volume 50 inside the second separating wall 21. A further protection device in form of a roof structure 70 is illustrated, which again prevents debris, such as rocks, sand or the like from entering the second inner volume 50.

In the example of FIG. 5, a further embodiment of the pressure compensator 100 is illustrated, to which the above given explanations and modifications can equally be applied. In the embodiment of FIG. 5, the pressure compensator 100 has two second compensation chambers 20 and 120. The first compensation chamber 10 includes two first separating walls 11, 111, each having a first bellows portion 12, 112, respectively. Each second compensation chamber 20, 120 includes a second separating wall 21, 121, each having a second bellows portion 22, 122. The two second compensation chambers 20, 120 are separated by a third separating wall 90. Such configuration has the advantage that if one of the second bellows portions 22, 122 should leak, for example due to corrosion, operation of the respective part of the pressure compensator can be stopped, and pressure compensation may continue by way of the other second compensation chamber. Operation may for example be stopped by providing a valve between the respective second inner volume 50, 150 and the ambient medium, so that the flow of ambient medium into and out of the respective second inner volume 50, 150 can be stopped. This way, damage to the respective inner bellows, i.e. the bellows portion 12 or 112, may be prevented. Further, the ingress of extensive amounts of seawater into the first chamber 10 of the compensator 100 may be prevented.

Further modifications of the pressure compensator 100 are conceivable. As an example, it may comprise two, three, four or more second compensation chambers 20. The outer wall 31 may have in the example of FIG. 1 for example a rectangular or oval cross section. A guiding arrangement and protection devices as described above may further be provided.

It should be clear that the features of the embodiments described above can be combined with each other. As an example, the embodiment of FIG. 1 may be provided with the guiding arrangement 80 of FIG. 2 and the protection devices 60, 70 of FIG. 4. Other modifications may for example include providing the guiding arrangement 80 outside the first and second compensation chambers 10, 20, for example within the second inner volume 50.

As can be seen from the above explanations, the pressure compensator 100 may achieve a significant compensation capacity for volume changes of the liquid filling chamber 220. At the same time, the first and the second compensation chambers 10, 20 may have only small dead volumes. Furthermore, the first bellows portion 12 is protected against the corrosive subsea environment.

While specific embodiments are disclosed herein, various changes and modifications can be made without departing from the scope of the invention. The present embodiments are to be considered in all respects as illustrative and non-restrictive, and all changes coming within the meaning and equivalency range of the appended claims are intended to be embraced therein.

The aforementioned description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods. Further, elements and/or features of different example embodiments may be combined with each other and/or substituted for each other within the scope of this disclosure and appended claims.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Still further, any one of the above-described and other example features of the present invention may be embodied in the form of an apparatus, method, system, etc. For example, of the aforementioned methods may be embodied in the form of a system or device, including, but not limited to, any of the structure for performing the methodology illustrated in the drawings.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

None of the elements recited in the claims are intended to be a means-plus-function element within the meaning of 35 U.S.C. §112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A pressure compensator for providing pressure compensation for a chamber of a subsea device, comprising:
   an enclosure including at least an outer wall
   a first compensation chamber provided inside the enclosure;
   a flow connection from the first compensation chamber towards the chamber of the subsea device;
   a first separating wall arranged inside the enclosure, the first separating wall including at least part of the first compensation chamber is formed between the outer wall and the first separating wall, the first separating wall extending around a first inner volume and providing separation between the first inner volume and the first compensation chamber;
   a second compensation chamber provided inside the enclosure; and
   a second separating wall arranged inside the enclosure, the second separating wall arranged inside the enclosure, the second separating wall including a second bellows portion and extending at least partially into the first inner volume, wherein at least part of the second compensation chamber is formed between the first separating wall and the second separating wall, the second separating wall extending around a second inner volume and providing separation between the second compensation chamber and the second inner volume, and wherein the first bellow portion and the second bellow portion are deformable to provide pressure compensation between the chamber of the subsea device and the second inner volume
   wherein the outer wall is a rigid outer wall that substantially maintains its shape during operation of the pressure compensator.

2. The pressure compensator of claim 1, wherein the second inner volume is in flow communication with an ambient medium, wherein in operation, ambient medium is present inside the second inner volume, the second separating wall providing separation between the second compensation chamber and the ambient medium.

3. The pressure compensator of claim 1, wherein the first compensation chamber includes an annularly shaped portion formed between the outer wall and the first separating wall.

4. The pressure compensator of claim 1, wherein at least one of the outer wall, the first separating wall and the second separating wall includes a circumferentially extending shape.

5. The pressure compensator of claim 4, wherein when viewed in a cross section along a central axial direction of the pressure compensator, the first compensation chamber includes a U-shape.

6. The pressure compensator of claim 1, further comprising at least one of:
   a first movable end wall, the first movable end wall being mounted and sealed to an end of the first separating wall being mounted and sealed to an end of the first separating wall and being movable with a deformation of the first bellow portion, and
   a second movable end wall, the second movable end wall being mounted and sealed to an end of the second separating wall and being movable with a deformation of the second bellows portion.

7. The pressure compensator of claim 1,
   wherein the first and second bellows portions are both connected to the outer wall.

8. The pressure compensator of claim 1, wherein at least the outer wall provides separation of the first compensation chamber towards an ambient medium so that the first bellow portion of the first separating wall is protected from ambient medium by said first compensation chamber and said outer wall.

9. A pressure compensator for providing pressure compensation for a chamber of a subsea device, comprising:
   an enclosure including at least an outer wall;
   a first compensation chamber provided inside the enclosure
   a flow connection from the first compensation chamber towards the chamber of the subsea device;
   a first separating wall arranged inside the enclosure, the first separating wall including at least part of the first compensation chamber is formed between the outer wall and the first separating wall, the first separating wall extending around a first inner volume and providing separation between the first inner volume and the first compensation chamber;
   a second compensation chamber provided inside the enclosure;
   a second separating wall arranged inside the enclosure, the second separating wall arranged inside the enclosure, the second separating wall including a second bellows portion and extending at least partially into the first inner volume, wherein at least part of the second compensation chamber is formed between the first separating wall and the second separating wall, the second separating wall extending around a second inner volume and providing separation between the second compensation chamber and the second inner volume, and wherein the first bellow portion and the second bellow portion are deformable to provide pressure compensation between the chamber of the subsea device and the second inner volume; and an annular wall section mounted to the outer wall and extending radially inwardly, wherein an end of at least the first separating wall is mounted and sealed to the annular wall section.

10. The pressure compensator of claim 9, wherein one end of said second separating wall is mounted and sealed to said annular wall section, or wherein the pressure compensator comprises a further annular wall section mounted to the outer wall and extending radially inwardly, the end of the second separating wall being mounted and sealed to the further annular wall section.

11. A pressure compensator for providing pressure compensation for a chamber of a subsea device, comprising:
an enclosure including at least an outer wall;
a first compensation chamber provided inside the enclosure;
a flow connection from the first compensation chamber towards the chamber of the subsea device;
a first separating wall arranged inside the enclosure, the first separating wall including at least part of the first compensation chamber is formed between the outer wall and the first separating wall, the first separating wall extending around a first inner volume and providing separation between the first inner volume and the first compensation chamber;
a second compensation chamber provided inside the enclosure
a second separating wall arranged inside the enclosure, the second separating wall arranged inside the enclosure, the second separating wall including a second bellows portion and extending at least partially into the first inner volume, wherein at least part of the second compensation chamber is formed between the first separating wall and the second separating wall, the second separating wall extending around a second inner volume and providing separation between the second compensation chamber and the second inner volume, and wherein the first bellow portion and- the second bellow portion are deformable to provide pressure compensation between the chamber of the subsea device and the second inner volume; and
wherein the outer wall extends circumferentially around an inner volume and is at one end mounted and sealed to an outer end wall, the first separating wall including a tubular shape and being at one end mounted and mechanically fixed to the outer wall by an annular wall section, the other end of the first separating wall extending inside the inner volume towards the outer end wall and being mounted and sealed to a movable end wall, the first compensation chamber being bounded by at least the outer wall, the outer end wall, the first separating wall and the movable end wall and by the annular wall section.

12. the pressure compensator of claim 1, wherein the outer wall extends circumferentially around an inner volume and is at one end mounted and sealed to an outer end wall, the second separating wall including a tubular shape and being at one end mounted and mechanically fixed to the outer wall by an annular wall section, the other end of the second separating wall extending inside the inner volume towards the outer end wall and being mounted and sealed to a movable end wall, the second compensation chamber being bounded by at least the first separating wall, the second separating wall, and the movable end wall and by the annular wall section.

13. The pressure compensator of claim 1, wherein the outer wall extends circumferentially around an inner volume, the first compensation chamber occupying only a fraction of said inner volume.

14. The pressure compensator of claim 1, wherein the pressure compensator comprises at least two second compensation chambers and comprises at least a third separating wall to provide separation between the at least two second compensation chambers.

15. A subsea device, comprising:
the pressure compensator of claim 1 for providing pressure compensation for a chamber of the subsea device.

16. A method of manufacturing a pressure compensator for providing pressure compensation for a chamber of a subsea device, comprising:
providing an enclosure including at least an outer wall;
providing a first compensation chamber inside the enclosure by arranging a first separating wall inside the enclosure, at least part of the first compensation chamber being formed between the outer wall and the first separating wall, the first separating wall including a first bellows portion and extending around a first inner volume, the first separating wall providing separation between the first inner volume and the first compensation chamber;
providing a second compensation chamber inside the enclosure by arranging a second separating wall inside the enclosure, the second separating wall including a second bellows portion and extending at least partially into the first inner volume, wherein at least part of the second compensation chamber is formed between the first separating wall and the second separating wall, the second separating wall extending around a second inner volume and providing separation between the second compensation chamber and the second inner volume; and
providing a flow connection from the first compensation chamber towards the chamber of the subsea device, wherein the first bellows portion and the second bellow portion are deformable to provide pressure compensation between the chamber of the subsea device and the second inner volume
wherein the outer wall is a rigid outer wall that substantially maintains its shape during operation of the pressure compensator.

17. The pressure compensator of claim 4, wherein at least one of the outer wall, the first separating wall and the second separating wall includes a cylindrical or tubular shape.

18. The pressure compensator of claim 8, wherein the ambient medium is seawater.

19. The pressure compensator of claim 11, wherein the first separating wall is, at one end, mounted and mechanically fixed to the outer wall via an annular wall section, the first compensation chamber being bounded by at least the outer wall, the outer end wall, the first separating wall and the movable end wall, via said annular wall section.

20. The pressure compensator of claim 12, wherein the second separating wall is, at one end, mounted and mechanically fixed to the outer wall via an annular wall section and wherein the second compensation chamber is bounded by at least the first separating wall, the second separating wall, and the movable end wall, via said annular wall section.

21. The subsea device of claim 15, wherein the subsea device is a subsea transformer, a subsea converter or a subsea switchgear.

22. A subsea device, comprising:
the pressure compensator of claim 2 for providing pressure compensation for a chamber of the subsea device.

23. the subsea device of claim 22, wherein the subsea device is a subsea transformer, a subsea converter or a subsea switchgear.

\* \* \* \* \*